(12) United States Patent
Yu et al.

(10) Patent No.: US 8,044,409 B2
(45) Date of Patent: Oct. 25, 2011

(54) III-NITRIDE BASED SEMICONDUCTOR STRUCTURE WITH MULTIPLE CONDUCTIVE TUNNELING LAYER

(75) Inventors: Chia-Lin Yu, Sigang (TW); Ding-Yuan Chen, Taichung (TW); Chen-Hua Yu, Hsin-Chu (TW); Wen-Chih Chiou, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 349 days.

(21) Appl. No.: 12/189,562

(22) Filed: Aug. 11, 2008

(65) Prior Publication Data
US 2010/0032718 A1 Feb. 11, 2010

(51) Int. Cl.
*H01L 27/15* (2006.01)
(52) U.S. Cl. ............ 257/79; 257/22; 257/103; 257/189; 257/E33.001; 257/E33.03; 257/E33.033
(58) Field of Classification Search .................... 257/22, 257/79, 103, 189, E33.001, E33.03, E33.033
See application file for complete search history.

(56) References Cited

U.S. PATENT DOCUMENTS

| 6,350,999 | B1 | 2/2002 | Uenoyama et al. |
| 6,617,060 | B2 | 9/2003 | Weeks, Jr. et al. |
| 7,115,896 | B2 | 10/2006 | Guo et al. |
| 2001/0009134 | A1 | 7/2001 | Kim et al. |
| 2007/0296335 | A1* | 12/2007 | Nihashi et al. ................. 313/542 |
| 2008/0048176 | A1* | 2/2008 | Orita et al. ...................... 257/22 |
| 2008/0054248 | A1* | 3/2008 | Chua et al. ...................... 257/14 |
| 2010/0015787 | A1* | 1/2010 | Yu et al. ......................... 438/483 |

\* cited by examiner

*Primary Examiner* — Andy Huynh
(74) *Attorney, Agent, or Firm* — Slater & Matsil, L.L.P.

(57) ABSTRACT

A semiconductor structure includes a substrate and a conductive carrier-tunneling layer over and contacting the substrate. The conductive carrier-tunneling layer includes first group-III nitride (III-nitride) layers having a first bandgap, wherein the first III-nitride layers have a thickness less than about 5 nm; and second III-nitride layers having a second bandgap lower than the first bandgap, wherein the first III-nitride layers and the second III-nitride layers are stacked in an alternating pattern. The semiconductor structure is free from a III-nitride layer between the substrate and the conductive carrier-tunneling layer. The semiconductor structure further includes an active layer over the conductive carrier-tunneling layer.

17 Claims, 2 Drawing Sheets

III-NITRIDE BASED SEMICONDUCTOR STRUCTURE WITH MULTIPLE CONDUCTIVE TUNNELING LAYER

TECHNICAL FIELD

This invention relates generally to semiconductor device manufacturing processes, and more particularly to forming group-III nitride (III-nitride) films, and even more particularly to forming superlattice III-nitride films on silicon substrates.

BACKGROUND

Group-III nitride (often referred to as III-nitride, or III-N) compounds, such as gallium nitride (GaN) and its related alloys, have been under intense research in recent years due to their promising applications in electronic and optoelectronic devices. Particular examples of potential optoelectronic devices include blue light emitting diodes and laser diodes, and ultra-violet (UV) photo-detectors. The large bandgap and high electron saturation velocity of the III-nitride compounds also make them excellent candidates for applications in high-temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$) substrates. However, a current problem with the manufacturing of GaN thin films is that there is no readily available suitable substrate material whose lattice constant and thermal expansion coefficient closely matching that of GaN. Among the possible substrates for GaN, silicon substrates were explored. Silicon substrates are attractive for GaN growth given their low cost, large diameters, high crystal and surface quality, controllable electrical conductivity, and high thermal conductivity. The use of silicon wafers promises easy integration of GaN based optoelectronic devices with silicon-based electronic devices.

A conventional optoelectronic (a light-emitting diode) device 2 is shown in FIG. 1, which includes a substrate, an AlN layer on the substrate, a superlattice layer on the AlN layer, and a light-emitting diode (LED) on the superlattice layer. The superlattice layer is formed of stacked AlN and GaN layers having equal thicknesses. The LED includes an n-type III-nitride layer, an active layer, and a p-type III-nitride layer. The AlN layer has the function of reducing the stress caused by the difference in coefficients of thermal expansion (CTE) between the substrate and the overlying III-nitride layers. However, the AlN layer has a high resistivity, and its existence prevents the formation of vertical LEDs whose contacts are on opposite sides of the substrate. The contacts to the p-type and n-type III-nitride layers thus have to be formed on the same side of the substrate. To form desirable vertical LEDs, this issue has to be addressed.

SUMMARY OF THE INVENTION

In accordance with one aspect of the present invention, a semiconductor structure includes a substrate and a conductive carrier-tunneling layer over the substrate. The conductive carrier-tunneling layer includes first group-III nitride (III-nitride) layers having a first bandgap, wherein the first III-nitride layers have a thickness less than about 5 nm; and second III-nitride layers having a second bandgap lower than the first bandgap, wherein the first III-nitride layers and the second III-nitride layers are stacked in an alternating pattern. The semiconductor structure is free from a III-nitride layer between the substrate and the conductive carrier-tunneling layer. The semiconductor structure further includes an active layer over the conductive carrier-tunneling layer.

In accordance with another aspect of the present invention, a semiconductor structure includes a substrate; a conductive carrier-tunneling layer over the substrate; and an active layer over the conductive carrier-tunneling layer. The conductive carrier-tunneling layer includes first III-nitride layers having a first bandgap, wherein the first III-nitride layers have first thicknesses; and second III-nitride layers having a second bandgap lower than the first bandgap. The second III-nitride layers have second thicknesses greater than the first thicknesses. The first III-nitride layers and the second III-nitride layers are stacked in an alternating pattern.

In accordance with yet another aspect of the present invention, a semiconductor structure includes a conductive substrate and a conductive carrier-tunneling layer over the conductive substrate. The conductive carrier-tunneling layer includes a plurality of first III-nitride layers having a first bandgap, wherein the plurality of first III-nitride layers has a substantially same first thickness; and a plurality of second III-nitride layers having a second bandgap lower than the first bandgap, wherein the plurality of first III-nitride layers and the a plurality of second III-nitride layers are stacked in an alternating pattern, and wherein the second III-nitride layers have substantially a same second thickness greater than the same first thickness. The semiconductor structure further includes a third III-nitride layer over the conductive carrier-tunneling layer; an active layer over the third III-nitride layer; and a fourth III-nitride layer over the active layer. The third III-nitride layer and the fourth III-nitride layer are of opposite conductivity types. The semiconductor structure is free from III-nitride materials between the conductive carrier-tunneling layer and the conductive substrate.

The advantageous features of the present invention include reduced resistivity due to the removal of an AlN layer, and balanced stress due to unbalanced thickness of different materials in the superlattice layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming circuit structures comprising group-III nitride (often referred to as III-nitride, or III-N) layers is provided. The intermediate stages of manufacturing preferred embodiments of the present invention are discussed. Throughout the various views and illustrative embodiments of the present invention, like reference numbers are used to designate like elements.

Figure 1:
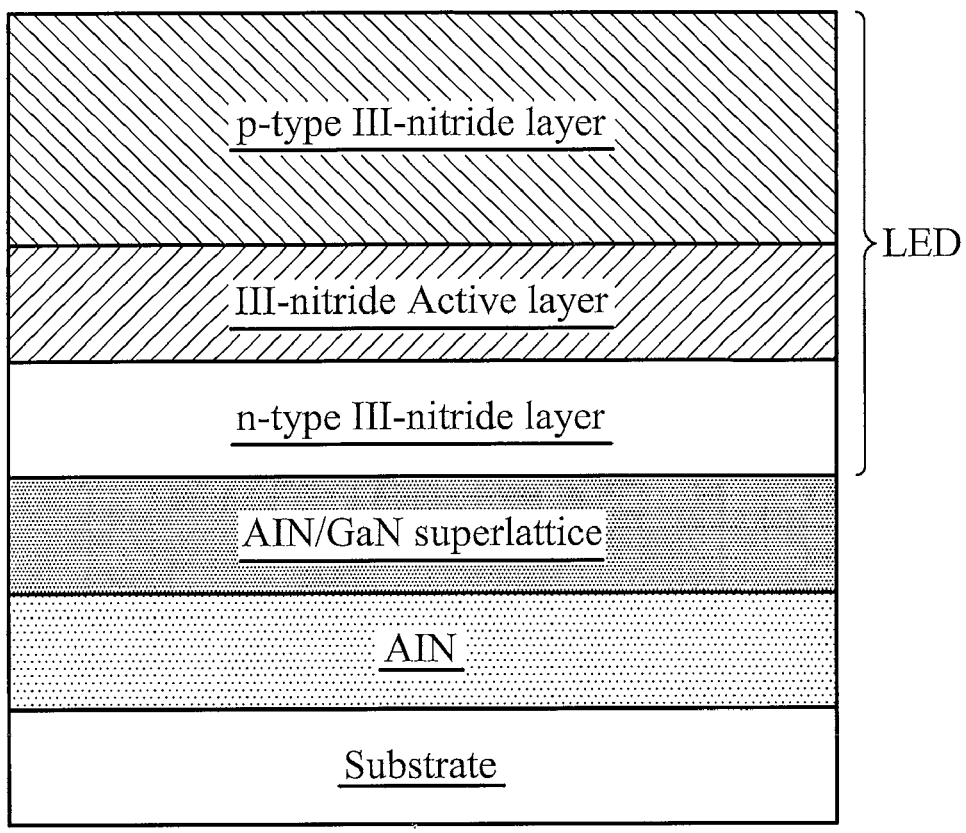
FIG. 1 illustrates a conventional circuit structure comprising an aluminum nitride (AlN) layer, and a superlattice layer on the AlN layer.
Figure 2:
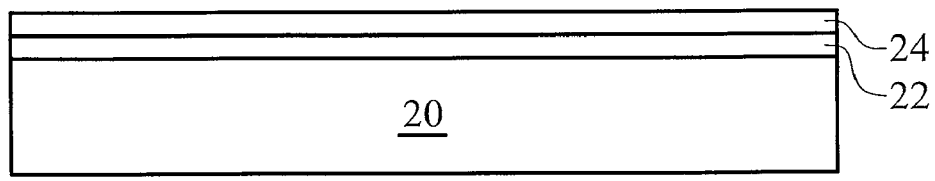
FIGS. 2 through 4 illustrate intermediate stages in the formation of an embodiment of the present invention, wherein no AlN layer is formed between a superlattice structure and the underlying substrate.

Referring to FIG. 2, substrate 20 is provided. In an embodiment, substrate 20 is a conductive or semi-conductive substrate comprising GaN, Si, Ge, SiGe, SiC, ZnO, SnS, SnSe, GaP, GaAs, or combinations thereof. When substrate 20 is a crystalline silicon substrate, it preferably has a (111) surface orientation, although silicon substrates with other surface orientations such as (100) and (110) are also usable. Substrate 20 may be a bulk substrate, or may have a composite structure having more than one layer formed of different materials. Substrate 20 is preferably annealed in a reaction chamber, which may use a chamber designed for metal-organic chemical vapor deposition (MOCVD), to remove contamination. The anneal may be performed at, for example, about 1100° C.

Optionally, pre-seeding layer 22 and/or transition layer 24 are formed on substrate 20. Preferably, the materials of the pre-seeding layer 22 and transition layer 24 are selected from conductive or semi-conductive materials. Pre-seeding layer 22 may be formed of metals such as Al, Mg, Ga, In, Zn, and/or combinations thereof, or metal alloys. Transition layer 24 may include InGaN, InAlN, metals, metal alloys, metal carbides or metal carbon-nitrides such as TiCN, TaCN. Pre-seeding layer 22 and transition layer 24 may be deposited at about 750° C. In alternative embodiments, no pre-seeding layer 22 and transition layer 24 are formed, and the subsequently formed conductive carrier-tunneling layer 30 (refer to FIG. 3) may be formed directly on and contacting substrate 20.

Figure 3:
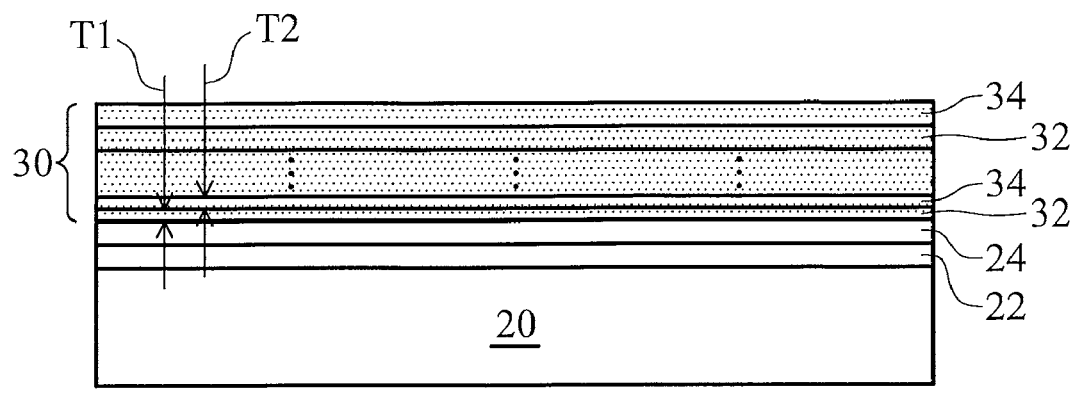

Next, as shown in FIG. 3, conductive carrier-tunneling layer 30 is formed. Conductive carrier-tunneling layer 30 may include a plurality of first layers 32 having a first bandgap and a plurality of second layers 34 having a second bandgap stacked in an alternating pattern, wherein the number of first layers 32 and/or the number of second layers 34 is preferably greater than about 10, although the numbers may be smaller. Preferably, the first layers 32 and the second layers 34 are both III-nitride layers, and more preferably III-nitride semiconductor layers. The first bandgap is greater than the second bandgap. In an exemplary embodiment, the first layers 32 are AlN layers, and the second layers 34 are GaN layers. In other embodiments, the first layers 32 and the second layers 34 may be $Al_xGa_{(1-x)}N$ and $In_yGa_{(1-y)}N$ layers, respectively, wherein x and y are greater than 0 and less than or equal to 1. In yet other embodiments, first layers 32 and second layers 34 may be $Ga_tAl_{(1-t)}N$ and $In_sAl_{(1-s)}N$, respectively, wherein s and t are also greater than 0 and less or equal to 1. The conductive carrier-tunneling layer 30 may be doped with a p-type or an n-type impurity, or substantially un-doped.

The thickness T1 of the first layers 32 is preferably substantially less than the thickness T2 of the second layers 34. In an exemplary embodiment, thickness T1 is less than about 80 percent, and more preferably less than about 50 percent, and even more preferably less than about 30 percent, of thickness T2. Different ones of first layers 32 may have the same, or different thickness T1. Preferably, the thickness of each first layers 32 is smaller than the overlying one of second layers 34. Advantageously, with thickness T2 greater than thickness T1, the second layers (especially GaN layers) may partially compensate for the stress generated by the other layers over substrate 20. The thickness T2 may be increased to improve the stress-compensation effect. Further, due to the relatively high bandgap of first layers 32, thickness T1 of first layers 32 (for example, AlN layers) needs to be small enough to allow carriers to tunnel through. More preferably, thickness T1 is small enough to allow direct tunneling of the carrier to occur. It is realized that the thickness T1 allowing carrier tunneling is related to the bandgap of the respective material, and the greater the bandgap is, the smaller thickness T1 is preferred.

With the small thickness T1, second layers 34 of the conductive carrier-tunneling layer 30 may, or may not, have sub energy bands (sub conduction bands and non-conduction bands located in an alternating pattern.). Accordingly, the operation of the conductive carrier-tunneling layer 30 may, or may not, require discrete voltages for carriers to tunnel through. When conductive carrier-tunneling layer 30 does not have discrete sub-conduction bands, voltages applied on the opposite sides of conductive carrier-tunneling layer 30 can be continuously increased, while conductive carrier-tunneling layer 30 remains conductive.

In an exemplary embodiment in which the first layers are formed of AlN, thickness T1 is preferably less than about 5 nm, and more preferably between about 1 nm and about 4 nm. On the other hand, each of the second layers 34 preferably has a thickness of between about 0.2 nm and about 50 nm, and more preferably between about 3 nm and about 10 nm. In an exemplary conductive carrier-tunneling layer 30, the thickness of each AlN layers 32 is about 3 nm, while the thickness of each GaN layers 34 is about 5 nm.

When first layers 32 and second layers 34 are formed of AlN and GaN, respectively, the formation temperature of the AlN layer is preferably greater than about 900° C., for example, at about 1050° C. The GaN layers may be formed at about 1050° C. The formation methods of first layers 32 and second layers 34 includes MOCVD, physical vapor deposition, molecular beam epitaxy (MBE), hydride vapor phase epitaxy (HVPE), liquid phase epitaxy (LPE), or other applicable deposition methods.

Figure 4:
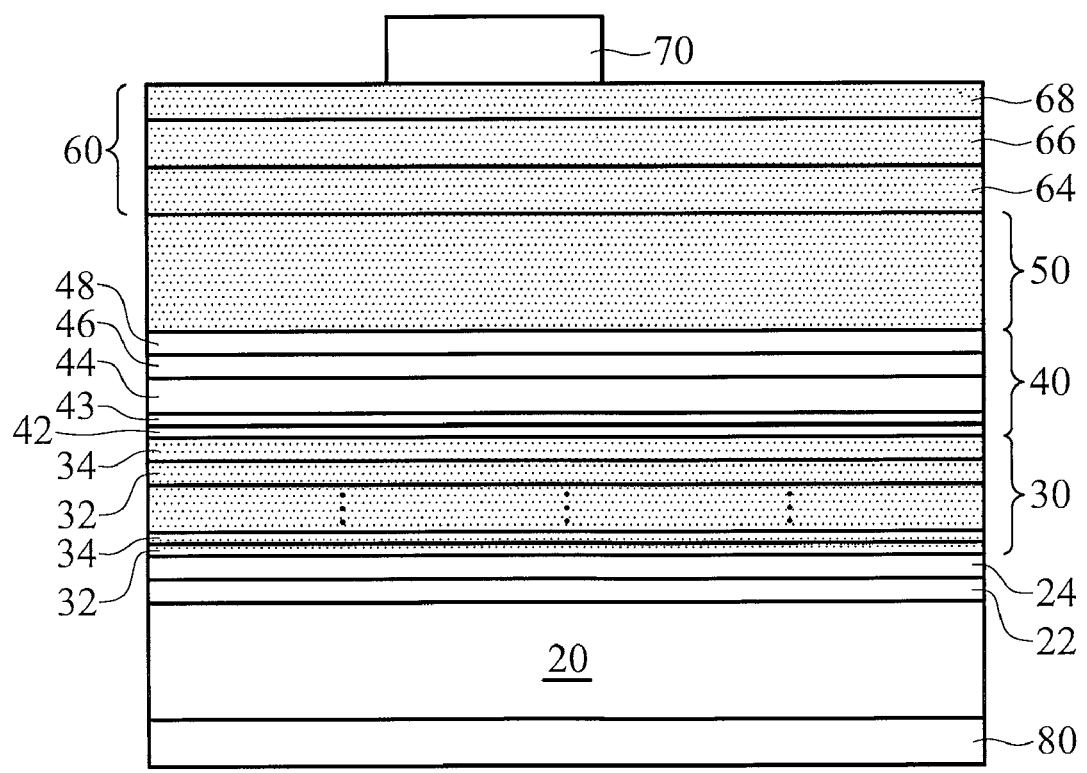

Next, as shown in FIG. 4, p-type III-nitride layers 40 are formed over conductive carrier-tunneling layer 30. P-type III-nitride layers 40 may include one or more of III-nitride contact layer 42, III-nitride crack-preventing layer 43, III-nitride cladding layer 44, III-nitride optical wave-guide layer 46, and/or III-nitride cap layer (also referred to as an electron blocking layer) 48 in any combination, depending on the preferred application of the resulting semiconductor structure. Although all of the layers 42, 43, 44, 46 and 48 are shown in FIG. 4, typically, in a circuit structure, only some, but not all, of the layers are formed. The formation of layers 42, 43, 44, 46 and 48 are briefly described as follows.

III-nitride contact layer 42 may act as a contact layer for a positive electrode (not shown). The thickness of III-nitride contact layer 42 may be in the range from about 10 nm to about 0.3 um. In an exemplary embodiment, III-nitride contact layer 42 is formed of GaN doped with Mg to reduce the ohmic contact resistance. The p-type impurity doping concentration may be about $1E20/cm^3$. III-nitride contact layer 42 may be formed using MOCVD, MBE, HVPE, LPE, or the like, at a relatively high temperature, for example, about 1050° C. In other embodiments, III-nitride contact layer 42 may be formed of p-type InN, p-type AlN, or the like.

III-nitride crack-preventing layer 43 may be made of, for example, InGaN doped with Mg, wherein the p-type impurity doping concentration may be about $5E18/cm^3$. The thickness of III-nitride crack-preventing layer 43 may be, for example, between about 10 nm and about 200 nm, and more preferably about 50 nm.

In an exemplary embodiment, III-nitride cladding layer 44 comprises $Al_{0.2}Ga_{0.8}N$ doped with Mg. The p-type impurity concentration may be about $1E20/cm^3$. The formation methods of III-nitride cladding layer 44 may be essentially the same as the method for forming III-nitride contact layer 42.

III-nitride cladding layer 44 functions as a photon-confinement layer. The thickness is preferably controlled within a range from about 10 nm to about 50 nm, and more preferably about 30 nm.

III-nitride optical wave-guide layer 46 may comprise GaN or InGaN. The p-type impurity concentration may be about 1E20/cm$^3$. The thickness is preferably about 20 nm to about 0.1 μm. P-side wave-guide layer 46 functions as an optical wave-guide layer for the active layer.

III-nitride cap layer 48 (also referred to as an electron blocking layer) is formed over III-nitride optical wave-guide layer 46. In an exemplary embodiment, III-nitride cap layer 48 comprises $Al_{0.3}Ga_{0.7}N$, and is doped to p-type with a p-type impurity concentration of about 1E20/cm$^3$. The thickness may be between about 10 nm and about 50 nm, and more preferably about 30 nm. III-nitride cap layer 48 preferably has an energy bandgap higher than that of the subsequently formed active layer 50, and may be made of, for example, $Al_{0.3}Ga_{0.7}N$. The thickness may be about 10 nm to 50 nm, and more preferably about 30 nm.

Active layer 50 is formed over p-type layers 40. In an exemplary embodiment, active layer 50 comprises undoped n-type gallium indium nitride ($In_xGa_{(1-x)}N$). In alternative embodiments, active layer 50 includes other commonly used materials such as $Al_xIn_yGa_{(1-x-y)}N$, wherein x and y are greater than 0 and less than 1. In yet other embodiments, active layer 50 may be a multiple quantum well including multiple well layers (such as InGaN) and barrier layers (such as GaN) allocated in an alternating pattern. In yet other embodiments, active layer 50 is a double heterostructure (DH). Again, the formation methods include MOCVD, MBE, HVPE, LPE, or other applicable CVD methods.

Next, as also shown in FIG. 4, n-type III-nitride layers 60 is formed over active layer 50. The n-type III-nitride layers 60 may include one or more of the III-nitride optical wave-guide layer 64, III-nitride cladding layer 66, and III-nitride contact layer 68 in any combination, depending on the preferred application of the resulting semiconductor structure. The formation process and materials of layers 64, 66 and 68 are similar to that of layers 46, 44, and 42, respectively, except layers 60 may be doped to n-type. In an exemplary embodiment, the n-type doping concentration in n-type layers 60 is between about 1E18/cm$^3$ and about 1E20/cm$^3$.

After the formation of III-nitride layers 60, topside contact 70 is formed, and may be patterned. In the resulting structure as shown in FIG. 4, III-nitride layers 40, active layer 50, and III-nitride layers 60 form optoelectronic device, which may emit light when forward biased (with the voltage applied to n-type III-nitride layers 60 being lower than the voltage applied to p-type III-nitride layers 40), or act as a photo detector when reversed biased. However, the above-discussed III-nitride layers may be used to form other optoelectronic devices, which are also in the scope of the present invention.

Backside contact layer 80 may be formed on the backside of substrate 20. In an embodiment, backside contact layer 80 is a semiconductor layer heavily doped with an impurity having a same conductivity type as the impurity in substrate 20. A silicide layer (not shown) may be formed on the bottom side of backside contact layer 80. Alternatively, backside contact layer 80 includes an alloy such as aluminum-antimony alloy.

In the embodiment discussed in the preceding paragraphs, an n-side up optical device is discussed, wherein III-nitride layers 40 are of p-type, and III-nitride layers 60 are of n-type. In alternative embodiments, a p-side up LED structure may be formed, in which III-nitride layers 40 are of n-type, and III-nitride layers 60 are of p-type.

The embodiments of the present invention have several advantageous features. By removing the AlN layer from over the substrate, vertical optoelectronic devices, in which contacts to the p-type and n-type III-nitride GaN layers are formed on opposite sides of the substrate, may be formed without incurring the increase in the operation voltage. With the thickness of the big bandgap layers 32 in the superlattice layer reduced to allow carrier tunneling to occur, not only the operation voltage may be reduced, the operation voltages do not have the required discrete values, and hence the operation of the optical device is much easier.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   a conductive carrier-tunneling layer over the substrate, the conductive carrier-tunneling layer comprising:
      first group-III nitride (III-nitride) layers having a first bandgap, wherein the first III-nitride layers have a thickness less than about 5 nm; and
      second III-nitride layers having a second bandgap lower than the first bandgap, wherein the first III-nitride layers and the second III-nitride layers are stacked in an alternating pattern, wherein the semiconductor structure is free from a III-nitride layer between the substrate and the conductive carrier-tunneling layer;
   a metal carbon-nitride layer between the substrate and the conductive carrier-tunneling layer; and
   an active layer over the conductive carrier-tunneling layer.

2. The semiconductor structure of claim 1, wherein each of the first III-nitride layers has a first thickness less than a second thickness of an overlying one of the second III-nitride layers.

3. The semiconductor structure of claim 1, wherein the first III-nitride layers have substantially a same first thickness, the second III-nitride layers have substantially a same second thickness, and wherein the same first thickness is less than the same second thickness.

4. The semiconductor structure of claim 1, wherein the conductive carrier-tunneling layer is in contact with the substrate.

5. The semiconductor structure of claim 1 further comprising a pre-seeding layer between the conductive carrier-tunneling layer and the substrate.

6. The semiconductor structure of claim 1, wherein the substrate is a semiconductor substrate, and wherein there is no III-nitride layer disposed between the substrate and the conductive carrier-tunneling layer.

7. The semiconductor structure of claim 6, wherein the substrate is a semiconductor substrate, and wherein no aluminum nitride (AlN) layer is disposed between the substrate and the conductive carrier-tunneling layer.

8. A semiconductor structure comprising:
a substrate;
a conductive carrier-tunneling layer over the substrate, the conductive carrier-tunneling layer comprising:
first group-III nitride (III-nitride) layers formed of aluminum gallium nitride (AlGaN) and having a first bandgap, wherein the first III-nitride layers have first thicknesses; and
second III-nitride layers indium gallium nitride (InGaN) and having a second bandgap lower than the first bandgap, wherein the first III-nitride layers and the second III-nitride layers are stacked in an alternating pattern, and wherein the second III-nitride layers have second thicknesses greater than the first thicknesses; and
an active layer over the conductive carrier-tunneling layer.

9. The semiconductor structure of claim 8, wherein substantially each of the first thicknesses is less than about 80 percent of substantially each of the second thicknesses.

10. The semiconductor structure of claim 9, wherein each of the first thicknesses is less than about 30 percent of substantially any of the second thicknesses.

11. The semiconductor structure of claim 9, wherein each of the first thicknesses is less than about 5 nm.

12. The semiconductor structure of claim 8 further comprising a pre-seeding layer between the conductive carrier-tunneling layer and the substrate.

13. A semiconductor structure comprising:
a silicon substrate formed of a silicon-containing material;
a conductive carrier-tunneling layer over and contacting the silicon-containing material of the silicon substrate, the conductive carrier-tunneling layer comprising:
a plurality of first group-III nitride (III-nitride) layers formed of a same first material and having a first bandgap, wherein the plurality of first III-nitride layers have substantially a same first thickness; and
a plurality of second III-nitride layers formed of a same second material and having a second bandgap lower than the first bandgap, wherein the plurality of first III-nitride layers and a plurality of second III-nitride layers are stacked in an alternating pattern, wherein the silicon-containing material of the silicon substrate contacts one of the plurality of the first and the second III-nitride layers, and wherein the second III-nitride layers have substantially a same second thickness greater than the same first thickness;
a third III-nitride layer over the conductive carrier-tunneling layer;
an active layer over the third III-nitride layer; and
a fourth III-nitride layer over the active layer, wherein the third III-nitride layer and the fourth III-nitride layer are of opposite conductivity types.

14. The semiconductor structure of claim 13, wherein the same first thickness is between about 0.1 nm and about 4 nm.

15. The semiconductor structure of claim 13, wherein the same first thickness is less than about 80 percent of the same second thickness.

16. The semiconductor structure of claim 13, wherein the same first material is AlGaN, and the same second material is InGAN.

17. The semiconductor structure of claim 13, wherein the conductive carrier-tunneling layer is conductive for continuous operation voltages applied on opposite sides of the conductive carrier-tunneling layer.

* * * * *

UNITED STATES PATENT AND TRADEMARK OFFICE
CERTIFICATE OF CORRECTION

| | | |
|---|---|---|
| PATENT NO. | : 8,044,409 B2 | Page 1 of 1 |
| APPLICATION NO. | : 12/189562 | |
| DATED | : October 25, 2011 | |
| INVENTOR(S) | : Yu et al. | |

It is certified that error appears in the above-identified patent and that said Letters Patent is hereby corrected as shown below:

In Col. 7, line 13, claim 8, after "layers" insert --formed of--.
In Col. 8, line 28, claim 16, delete "InGAN" and insert --InGaN--.

Signed and Sealed this
Twenty-seventh Day of December, 2011

David J. Kappos
*Director of the United States Patent and Trademark Office*